(12) United States Patent
Pahl

(10) Patent No.: US 8,218,794 B2
(45) Date of Patent: Jul. 10, 2012

(54) COMPONENT COMPRISING A MEMS MICROPHONE AND METHOD FOR THE PRODUCTION OF SAID COMPONENT

(75) Inventor: Wolfgang Pahl, Munich (DE)

(73) Assignee: EPCOS AG, Munich (DE)

( * ) Notice: Subject to any disclaimer, the term of this patent is extended or adjusted under 35 U.S.C. 154(b) by 418 days.

(21) Appl. No.: 12/409,328

(22) Filed: Mar. 23, 2009

(65) Prior Publication Data

US 2009/0232336 A1    Sep. 17, 2009

Related U.S. Application Data

(63) Continuation of application No. PCT/DE2007/001754, filed on Sep. 27, 2007.

(30) Foreign Application Priority Data

Sep. 29, 2006  (DE) .......................... 10 2006 046 292

(51) Int. Cl.
*H04R 25/00* (2006.01)
*H04R 9/08* (2006.01)

(52) U.S. Cl. ........................................ 381/175; 381/355

(58) Field of Classification Search .................. 381/175, 381/355, 369; 257/704, 729, 730
See application file for complete search history.

(56) References Cited

U.S. PATENT DOCUMENTS

| | | | |
|---|---|---|---|
| 5,097,515 A | 3/1992 | Baba | |
| 5,573,679 A | 11/1996 | Mitchell et al. | |
| 6,396,711 B1 | 5/2002 | Degani et al. | |
| 6,686,642 B2 | 2/2004 | Regan et al. | |
| 6,878,638 B2 | 4/2005 | Regan et al. | |
| 7,166,910 B2 | 1/2007 | Minervini | |
| 7,434,305 B2 | 10/2008 | Minervini | |
| 2003/0230798 A1 | 12/2003 | Lin et al. | |
| 2004/0119143 A1 | 6/2004 | Karpman | |
| 2005/0077102 A1 | 4/2005 | Banter et al. | |
| 2005/0185812 A1 | 8/2005 | Minervini | |
| 2005/0189635 A1* | 9/2005 | Humpston et al. | 257/678 |
| 2005/0207605 A1* | 9/2005 | Dehe et al. | 381/369 |

(Continued)

FOREIGN PATENT DOCUMENTS

DE    10 2005 008 512 A1    8/2006

(Continued)

OTHER PUBLICATIONS

Brauer, M., et al., "Silicon microphone based on surface and bulk micromachining," Journal of Micromechanics and Microengineering, 2001, pp. 319-322, vol. 11. IOP Publishing Ltd.

*Primary Examiner* — Brian Ensey
(74) *Attorney, Agent, or Firm* — Slater & Matsil, L.L.P.

(57) ABSTRACT

A component with a housing for a MEMS microphone is proposed that has a cavity with terminals arranged in the cavity, a sound inlet opening, and SMT contacts on an outer side. The MEMS chip installed in this housing closes the sound inlet opening from the inside and is connected by means of electrically conductive connections to the terminals of the housing. Opposite the electrically conductive connections, the MEMS chip is in mechanically intimate contact with the housing. The dimensioning of the housing relative to the MEMS chip allows the cavity at the sides of the MEMS chip to be used as an acoustic rear volume.

13 Claims, 3 Drawing Sheets

U.S. PATENT DOCUMENTS

| | | |
|---|---|---|
| 2008/0247585 A1 | 10/2008 | Leidl et al. |
| 2008/0279407 A1 | 11/2008 | Pahl |

FOREIGN PATENT DOCUMENTS

| | | |
|---|---|---|
| DE | 10 2005 053 767 A1 | 5/2007 |
| EP | 1 266 863 A2 | 12/2002 |
| EP | 1 162 169 B1 | 7/2005 |
| JP | 51-131315 | 11/1976 |
| JP | 2006-153804 | 11/1976 |
| JP | 02-149199 A | 6/1990 |
| JP | 2004-072368 | 3/2004 |
| WO | WO 02/45463 A2 | 6/2002 |
| WO | WO 2005/086532 A2 | 9/2005 |
| WO | WO 2006/023016 A1 | 3/2006 |
| WO | WO 2006/085825 A1 | 8/2006 |

* cited by examiner

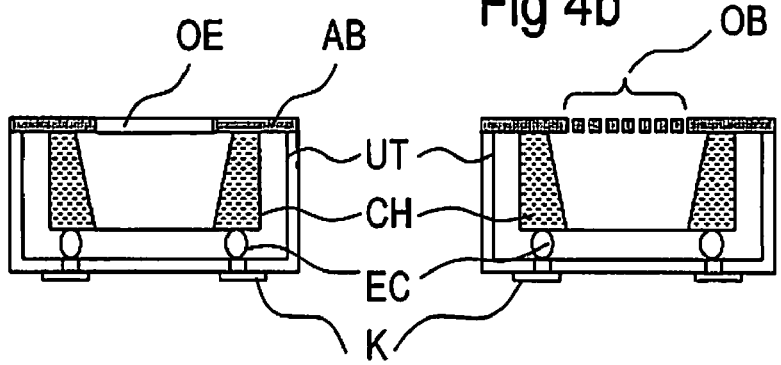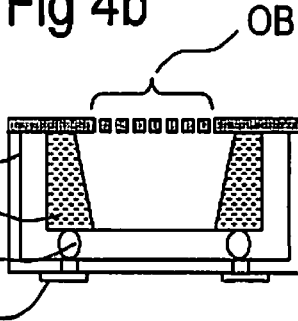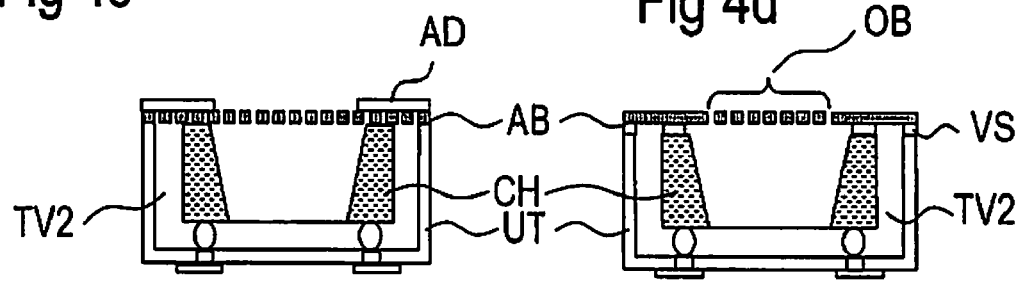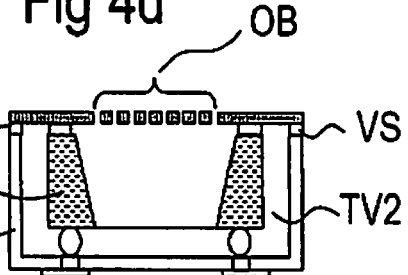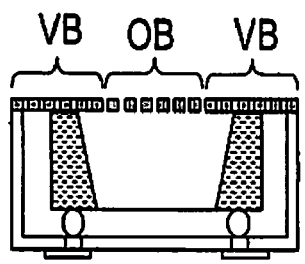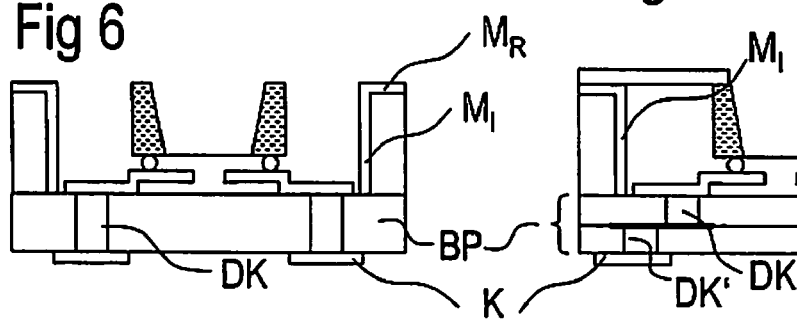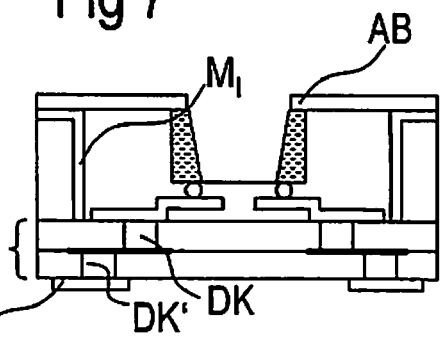

COMPONENT COMPRISING A MEMS MICROPHONE AND METHOD FOR THE PRODUCTION OF SAID COMPONENT

This application is a continuation of co-pending International Application No. PCT/DE2007/001754, filed Sep. 27, 2007, which designated the United States and was not published in English, and which claims priority to German Application No. 10 2006 046 292.0 filed Sep. 29, 2006, both of which applications are incorporated herein by reference.

TECHNICAL FIELD

The invention relates to a housing with a MEMS microphone installed in the housing and to a method for the production of the housing.

BACKGROUND

Miniaturized microphones can be produced in MEMS construction. A known operating principle consists in the measurement of a capacitance between a membrane excited into vibration by sound and an adjacent fixed counter electrode.

As a rule, a MEMS microphone is made from a MEMS chip of a thickness of a few 100 μm that has one or more membranes of a thickness of a few 100 nm. Normally, the membrane structures are formed essentially flush with a surface of the MEMS chip. The opposite surface then has a recess in the membrane region. This recess can be made available for the enclosed rear volume that is required for the microphone function and that is used as a static reference for the detection of the variable sound pressure.

The general trend toward miniaturization and cost reasons require smaller surface areas for the MEMS chip. Associated with this, however, is also a simultaneous reduction in the rear volume that can be achieved by the recess. When the membrane is deflected, however, this leads to an increased counter pressure that, in turn, prevents the deflection and that results in reduced sensitivity and worse noise properties.

From the U.S. Patent Application Publication No. US 2005/0185812, a microphone housing is known in which a microphone formed as a MEMS component is arranged together with a semiconductor chip on a base plate. The MEMS package includes a common cap with which the MEMS component is covered opposite the base plate.

A disadvantage in this configuration, however, is the relatively large component volume and the small portion of this volume used acoustically.

SUMMARY

In one aspect, the present invention specifies a component with a microphone in MEMS construction that has reduced dimensions, without negatively affecting its acoustic properties and sensitivity.

In one embodiment, a component is proposed in which a MEMS chip is installed in an enclosed housing so that it can use a relatively large part of the cavity formed by the housing as the rear volume. For this purpose, the MEMS chip is arranged in the housing above a sound inlet opening and closes this opening from the inside. By means of electrically conductive connections, it is connected to the interior to the terminals of the housing. With the housing inside relative to the electrically conductive connections, the MEMS chip is in mechanically intimate contact with the housing. On the housing inside facing away from the sound inlet opening, a sufficient passage between the MEMS chip and the housing inner wall is also maintained that makes available a connection between the microphone and the cavity in the housing at the sides of the MEMS chip and can form a common rear volume.

On the bottom side, the housing has SMT contacts (Surface Mounting Technology) by means of which the component can be mounted on a circuit board and electrically connected. The SMT contacts are connected through the housing by means of feedthroughs or vias to the terminals arranged on the inside for the MEMS chip. Below, the outside with the SMT contacts is designated as the bottom side independent of the embodiment.

The sound inlet opening can be arranged on the bottom side next to or between the SMT contacts and then requires a corresponding borehole in the circuit board for the sound inlet. The sound inlet opening, however, can also be arranged in the top side of the housing.

It is advantageous when the MEMS chip is arranged in the housing so that the electrical contacts of the MEMS chip point toward the bottom side and are connected to the terminals present there close to the SMT contacts via electrically conductive connections. In this case, the mechanically intimate contact can be realized purely mechanically on the back side of the MEMS chip, without electrical connections being required on this side. The mechanically intimate contact can be realized, for example, by means of an elastic compound that is arranged between the back side of the MEMS chip and the housing. An elastic compound has the advantage that mechanical stresses cannot be formed between the MEMS chip and the top inside of the housing. Here the elastic compound is spared at the positions at which a connection remains to the inside volume of the housing remaining on the sides of the MEMS chip.

On the inner housing base, the MEMS chip is advantageously attached by means of an electrical connection similar to a flip-chip. This connection includes an arrangement of the contacts of the MEMS chip and the terminals of the housing one above the other and production of a suitable, electrically conductive connection in-between. In a simple way, this can be realized by means of solder or stud bumps. While soldering is performed with solder material, bonding can also be performed by means of the stud bumps of the MEMS chips, e.g., by means of ultrasonic bonding. In addition to bonding and soldering, adhesion of the MEMS chip with an electrically conductive adhesive is also possible, because a microphone makes only relatively small requirements on the current carrying capacity and conductivity of the electrical connection. The adhesive can be set to be conductive anisotropically, so that no structuring of the adhesive layer is required in order to prevent a short circuit between the different contacts and terminals.

The electrical connection, however, can also be produced by means of a pressure contact. The durability of the electrical contact just through pressure can then be supported through elastic layers that ensure an elastic contact pressure on the opposite reverse side of the MEMS chip. However, it is also possible to provide intermediate layers made from conductive, elastic layers directly in the region of the pressure contact.

The contact or the electrically conductive connection can also be produced by means of metallic structures of any formation welded on one or two sides. The connection within the housing can be a contact surface or a pad. However, it is also possible to use the surface pointing inward of a contact hole (via) filled with an electrically conductive material directly as the connection. However, it is also possible that vias and terminals are not arranged congruent to each other or are offset laterally relative to each other and are connected to each other by strip conductors on the inner surface of the housing.

In another embodiment, the sound inlet opening of the housing points upward, while the MEMS chip at the bottom on the housing floor is connected to the terminals there, by means of the electrically conductive connections. Here it is possible to adhere the upward-pointing reverse side of the MEMS chip with the "lid" of the housing or to connect it tightly in some other way, so that the adhesive or connection position seals the partial volume enclosed between the MEMS chip and sound inlet opening from the rest of the volume within the housing. On the side of the MEMS chip pointing downward, the electrically conductive connections formed there ensure a sufficient spacing of the membrane to the floor of the housing and thus simultaneously a connection of the partial volume located under the MEMS chip to the rest of the housing volume. The closure between the MEMS chip and the "lid" can then be tight.

Independently of this situation, however, in all of the configurations a defined borehole is provided that connects the housing interior space with the outer surroundings of the housing, in order to allow an adaptation of the inner pressure used as a reference to a changed outer pressure. This borehole is dimensioned so that the pressure equalization can be realized with a sufficiently slow time constant of approximately 0.01 to 1.0 seconds that is slow relative to the audio frequency to be determined. Advantageously, the borehole is guided through the MEMS chip and generated, for example, by means of microstructuring techniques.

Advantageously, the housing is produced from a metallic material or has at least one metallic coating. This allows an electrostatic shielding and prevents, for example, the coupling of external interference signals.

In one embodiment, the housing has a bottom part and a cover, wherein, in the bottom part, a recess defining the cavity is provided. The cover can then be made from a planar, surface-mounted material and, in particular, from a foil.

Advantageously, a metal foil or a plastic foil coated with metal can be used for the cover. In particular, the sound inlet opening is structured into the cover. This opening can be, for example, stamped into the cover. A metallic foil as the cover furthermore has the advantage that it can be soldered, welded, or bonded onto a metallic or metal-coated bottom part. However, it is also possible to adhere the cover on the bottom part.

The sound inlet opening can include a single opening with sufficient area. However, it can also include an area with a plurality of smaller openings arranged in this area.

Furthermore, it is possible to use a foil that has been perforated across the entire surface area as a cover and to seal the small openings not needed for the sound inlet opening, for example, through a deposition process, only after the connection to the bottom part. With such a completely perforated foil it is also possible to deposit locally an adhesive or a sealing compound through the perforations, in order to realize a mechanically fixed connection that is optionally sealed relative to the interior of the housing between the cover and bottom part all around the sound inlet opening and at the joints to the bottom part.

In the case of adhesion it is advantageous to also connect the metallic or metal-coated cover and the metallic or metal-coated bottom part to each other in an electrically conductive way for improving the shielding effect. This can be realized with a through-hole through the cover toward the housing side wall or through a conductive adhesive.

In an advantageous configuration of the component, the electrically conductive connections are configured as spring elements. These can include metal structures that can deform elastically or plastically. These metal structures are attached in a first area to the terminals and in a second area to the contacts of the MEMS chip. The second area has an open spacing to the housing floor, wherein this spacing can be used as space for the elastic deformation of the spring elements and thus for the spring mounting of the MEMS chip within the housing.

The spring elements have the advantage that the MEMS chip is held elastically in the component, wherein, in the load case the spring force can have a maximum effect on the chip and the spring element acts against deformation. This guarantees that the MEMS chip is installed essentially without stress in the housing and forces that are too large cannot occur between the housing and chip even for mechanical loading of the housing or for thermal warping.

For absorbing tensile and compressive stresses, the spring elements advantageously have a non-linear profile that is bent or angled once or several times in one or more spatial directions. They can have a meander-like profile and can be made from a strip-shaped material independent of the profile and can have slits running longitudinally and/or transversely. The spring elements can also have a spiral-shaped configuration with one or more windings. Advantageously, they are constructed from metal, in order to guarantee the function as an electrically conductive connection.

The housing and, in particular, the bottom part can be produced from any material with sufficient mechanical stability. It can be made from metal, silicon, glass, plastic, or ceramic. The bottom part of the housing with the recess can be a uniform material, can be constructed in one piece with a recess, or can be assembled from several correspondingly structured, optionally different layers.

In a simple way, a bottom part with a recess is obtained in that an annular, enclosed frame is placed or mounted on a planar base plate, with this frame enclosing the interior volume of the housing.

The recess in the bottom part can be formed in advance or can be generated at a later time, for example, through the mentioned mounting of the frame. Independent of the material of the base plate, the frame can include, for example, a polymer material that can be printed on. The frame can also be produced from a ceramic material or a paste that contains or is filled with ceramic and/or metallic particles. The frame can also be generated galvanically on the base plate. It is also possible to generate the frame photolithographically from a resist layer, a resist foil, and, in particular, from a photo resist that can be structured directly. The resist layer can be deposited as lacquer through centrifugal forces, casting, immersion, or spraying. Advantageously, the resist layer is also to be deposited as a dry film, for example, through lamination, and then to be structured.

The structuring of a resist layer for the mounting of a frame structure for defining the cavity in the bottom housing part can be realized through phototechnology or direct structuring, such as laser ablation. Advantageously, the frame structure is metal coated at least on the inner walls and advantageously also on the edges or joint surfaces pointing upward, in order to guarantee, on the one hand, shielding of the housing and to create, on the other hand, a metallic joint surface for connecting to the cover.

The application of the metallization can also be used simultaneously for generating the spring elements. For this purpose, advantageously a sacrificial layer is deposited and then structured or deposited/structured directly, so that it forms a step over which a metal structure can later run for forming the spring element. After the removal of the sacrificial layer, the second area of the metal structure originally lying on the sacrificial layer has an open spacing to the housing floor.

The deposition or generation of a metal layer for the inner metallization of the housing and optionally simultaneously for the production of metal structures for terminals, electrically conductive connections, and/or spring elements can also be performed using several layers or in several steps, wherein, for different housing parts, different metallization layers or multiple-layer structures can be used.

Advantageously, the housing includes a circuit board that has SMT contacts on the bottom side and terminals connected to these contacts by means of through-holes in the interior of the housing. The circuit board can have a single-layer or multiple-layer configuration and includes at least one dielectric layer or a semiconductor, in particular, silicon, plastic, or ceramic. The circuit board can also be a laminated circuit board.

The bottom part with the recess formed in advance can also be an MID (Molded Interconnect Device) part. In principle, it is also possible, naturally, to use a circuit board as a base plate and to connect the cavity to a second, cap-shaped top part that already has the recess for the complete housing.

BRIEF DESCRIPTION OF THE DRAWINGS

Embodiments of the invention including a method for the production of the component will be explained in greater detail below with reference to embodiments and the associated figures. These are shown purely schematically and not true to scale, so that neither absolute nor relative dimensional information or size relationships can be inferred from these figures.

FIG. 1, show a component with a sound inlet opening at the top in the schematic cross section;

FIG. 2, show a component with a sound inlet opening at the bottom;

FIG. 3, show different ways to produce an electrical connection;

FIGS. 4A-4E, collectively FIG. 4, show different covers of a two-part housing;

FIG. 5, show the production of a component in which the electrical connections are constructed as spring elements;

FIG. 6 shows a component with inner metallization in the housing; and

FIG. 7 shows a component with a multiple-layer base plate.

DETAILED DESCRIPTION

FIG. 1 shows two embodiments of a component with a sound inlet opening OE at the top. The side lying opposite the (outer) side on which the SMT contacts K are arranged is considered to be the top side of the component. The MEMS chip CH itself is typically made from a base that is processed from a solid body and on which a layer that also includes the membrane (only indicated in the figure) is deposited, for example, using thin-film technology. Below the membrane, the base of the MEMS chip CH has a recess in order to allow free oscillation of the membrane or in order to provide an acoustic rear volume for the function of the microphone.

Figure 1A:
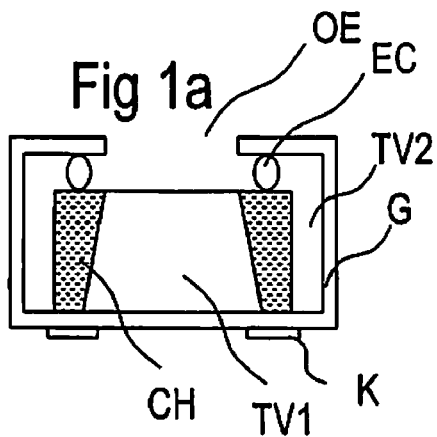
FIGS. 1A and 1B, collectively

FIG. 1A shows that on the top side with the membrane, the MEMS chip can be connected by means of the electrically conductive connection EC to the terminals that are located on the top inside of the housing (not shown in FIG. 1A). On the bottom side, the MEMS chip is connected in mechanically intimate contact to the bottom inside of the housing G and is connected there either by means of a pressure contact, an elastic layer, an adhesive, or some other connection method. The MEMS chip is thus clamped at the top and bottom in the housing G.

Underneath the membrane, the space enclosed between the membrane and bottom side of the housing and corresponding to the recess of the MEMS chip forms a first partial volume TV1 of the total volume acting as the rear volume. A second partial volume TV2 is made available by the space remaining at the sides of the MEMS chip CH between this chip and the housing G.

In order to be used as a common rear volume, the two partial volumes TV1 and TV2 are connected by means of one or more passages that are formed in advance, for example, in the bottom side of the MEMS chip or that remain between the bottom side of the MEMS chip and the housing G.

Through the MEMS chip sitting on the inside above the sound inlet opening OE, the second partial volume TV2 is sealed against the sound inlet opening OE. This can be realized by a sealing compound that is deposited in a ring shape, for example, on the top side of the MEMS chip and seals this chip against the top inside of the housing G.

In a not-shown embodiment of FIG. 1A, the MEMS chip is indeed arranged in the same orientation within the housing G, but is connected on its bottom side by means of electrically conductive connections to terminals on the bottom inside of the housing. This is possible when corresponding contacts are provided on the bottom side of the MEMS chip, wherein these contacts are connected by means of suitable lines to the electrical part of the MEMS component, for example, by means of a via through the MEMS chip. In this case, a seal enclosing the sound inlet opening OE can be provided between the top side of the MEMS chip and the top inside of the housing, for example, an adhesive and, in particular, silicone rubber.

Figure 1B:
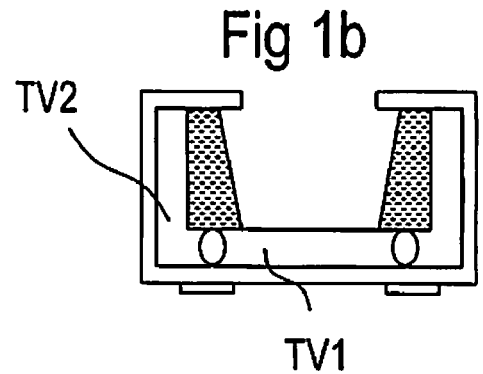

FIG. 1B shows an improved embodiment that distinguishes itself through simpler manufacturability. Here, the MEMS chip is installed head first, so that it points with the membrane side toward the bottom side of the housing. This has the advantage that the electrical contacts of the MEMS chip typically located on the membrane side are located directly opposite the SMT contacts on the outside of the housing G. By means of the electrically conductive connections EC to the terminals (not shown) on the bottom inside of the housing G, in a simple way a flip-chip like connection can be produced that is used simultaneously for the mechanical connection and for the electrical contacting of the MEMS chip and the terminals. While in FIG. 1A the electrical connections are arranged away from the SMT contacts and must be connected by means of additional strip conductors to the SMT contacts K, this can be eliminated in the embodiment according to FIG. 1B and a direct, face-to-face connection can be produced. A through-hole can be provided between the terminals on the inside and the SMT contacts K on the outside.

Figure 2A:
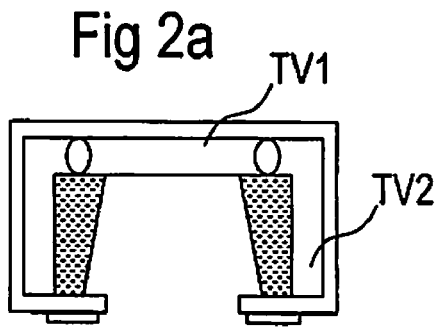
FIGS. 2A and 2B, collectively

FIG. 2 shows embodiments of the component with the sound inlet opening OE on the bottom in the housing. FIG. 2A shows an embodiment in which the MEMS chip points upward with the membrane. The electrically conductive connections EC can be performed as shown on the top side of the MEMS chip towards the top inside of the housing, where terminals are provided. It is also possible, however, to provide the electrically conductive connections on the bottom side directly opposite the SMT contacts K, wherein, on the bottom side of the MEMS chip, there are corresponding contacts that contact the electrical part and, in particular, the membrane.

In the embodiment according to FIG. 2A, the MEMS chip lying on the bottom inside of the housing seals the sound inlet opening OE. The first partial volume TV1 is arranged between the top inside of the housing and the membrane and is connected to the second partial volume TV2 that remains between the chip and side walls of the housing, e.g., by means of passages between the electrically conductive connections. Both partial volumes TV1 and TV2 together form the rear volume.

Figure 2B:
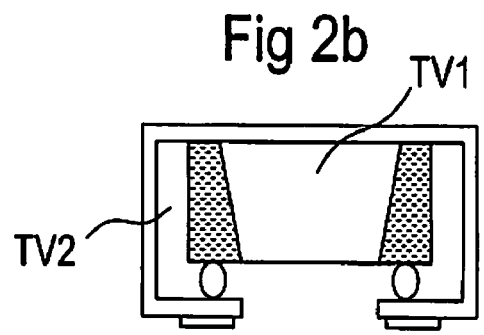

FIG. 2B shows a similar arrangement in which only the membrane side of the MEMS chip points downward. Here, it is also valid that the sound inlet opening is closed by the MEMS chip, which is guaranteed by the electrically conductive connections or through additional sealing layers. The first and second partial volumes TV1, TV2 are connected to each other by feedthroughs that are located between the top side of the MEMS chip and the housing inner wall.

FIG. 3 shows different possibilities to connect the MEMS chip by means of electrically conductive connections to the housing. These are shown in an arrangement according to FIG. 1B. However, it is also possible to use these different electrically conductive connections in connection with other embodiments shown in FIGS. 1 and 2.

Figure 3A:
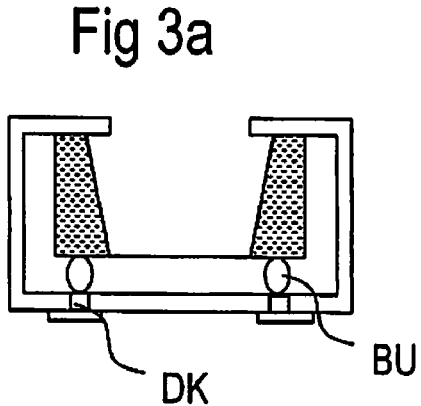
FIGS. 3A-3C, collectively

In FIG. 3A, the electrical connection is constructed as a bump BU or as a similar structure. It could be a solder bump, a stud bump, or a metallic post structure that is produced in some other way and on which the chip is bonded or soldered with its contacts. The bump BU connects the contacts (not shown) of the MEMS chip CH to the electrical terminals of the housing located here on the bottom inside of the housing. Shown here are also vias DK that connect the bump or the terminals to the outer SMT contacts K.

Figure 3B:
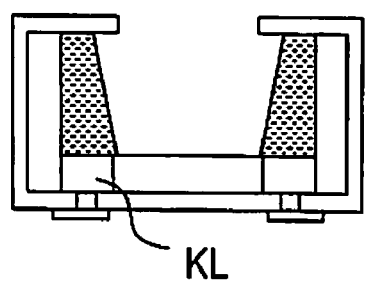

In FIG. 3B, the electrically conductive connection is constructed by means of an electrically conductive layer, e.g., an adhesive layer KL. The adhesive layer KL is either structured to prevent a short circuit between the two contacts or is formed as an anisotropically conductive adhesive layer in which planar conduction does not, in practice, take place within the adhesive layer and there is only vertical electrical conductivity through the adhesive layer.

Figure 3C:
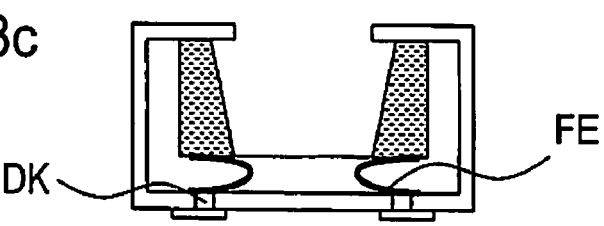

In FIG. 3C, each electrically conductive connection is constructed as a spring element FE. This guarantees an elastic attachment of the MEMS chip CH within the housing G. When installed, the chip can be installed under pressure onto the spring elements, wherein a biasing tension acting on the MEMS chip can be set.

FIG. 4A shows several possibilities for how a cover of the housing provided with a sound inlet opening OE can be constructed. Here it also applies that the shown covers are compatible with all of the configurations according to FIGS. 1 and 3, although they are shown only for a configuration according to FIG. 1B.

FIG. 4A shows a cover AB that is constructed as a foil with a central sound inlet opening OE. This cover is oriented so that it is arranged centrally above the MEMS chip CH and is closed by this cover against the second partial volume of the housing. The cover AB lies on a bottom housing part UT that has at least one recess defining the housing inner space.

In FIG. 4B, a cover AB is shown that has, in an opening region OB, a plurality of smaller openings that together form the sound inlet opening OE. The openings can be stamped, bored, lased, or etched. A preferred method for producing the openings is given from the material of the cover AB that is, in particular, a metal foil or a plastic foil coated with metal.

FIG. 4C shows an embodiment in which the cover is made from a continuous, perforated foil. The openings not assigned to the opening region OB are sealed with a sealing layer AD that is deposited locally, for example, at the top on the foil. It is also possible to deposit this sealing layer AD on the bottom side of the cover and, for example, to simultaneously use it for connecting the cover AB to the bottom part UT of the housing G and the top side of the MEMS chip CH.

FIG. 4D shows a cover that is connected with the aid of a connection layer VS to the top side of the MEMS chip and the bottom part of the housing G.

The connection layer VS is advantageously an elastic layer and, in particular, an elastic adhesive layer that allows a sufficiently tight closure of the housing by the cover and, in particular, a closure of the second partial volume TV2 against the sound inlet opening. The connection layer VS can be deposited over a large surface area on the bottom side of the cover AB in the region that does not correspond to the opening region OB. However, it is also possible to deposit the connection layer VS exclusively on the joints between the cover and bottom part either on the bottom part UT or on the cover AB.

FIG. 4E shows another embodiment in which a cover perforated across the entire surface area is used. The perforation is performed so that small openings are arranged in a dense pattern so that the mechanical stability of the cover is not endangered. This perforated cover layer can be initially placed on the bottom part of the MEMS chip during production. Then a connection material and, in particular, an adhesive is deposited from the top side of the cover locally above the joints and the connection regions VB to be sealed because they are not assigned to the opening region OB and are pressed through the openings of the perforation, so that these are closed. A mechanically stable and sufficiently sealed connection layer is generated through connection material emerging on the bottom side of the perforation.

FIG. 5 shows, as an example, with reference to different processing steps, how electrically conductive connections formed as spring elements FE could be generated within the housing. FIG. 5A shows, as a starting point, a bottom part UT of the housing that here includes a base plate BP and a frame structure RS. The base plate has, on the bottom side, SMT contacts K that are connected by means of vias DK to terminals on the inside of the bottom part. As shown here, the top sides, that is, the surfaces of the vias DK pointing toward the inner space, are used as terminals.

The frame structure RS and base plate BP can be produced from the same or different materials. Advantageously, the base plate is a circuit board on which a frame structure is deposited, for example, through printing, photostructuring, or galvanic deposition or some other method suitable for generating structures.

Figure 5A:
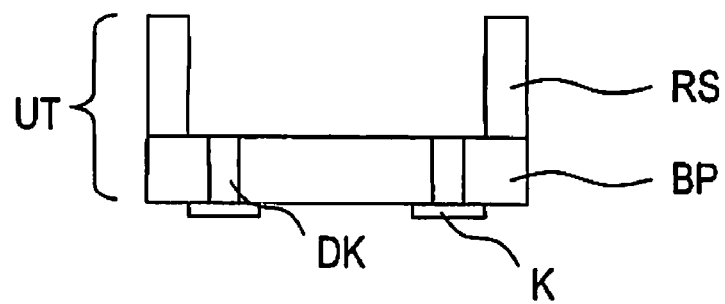
FIGS. 5A-5E, collectively
Figure 5B:
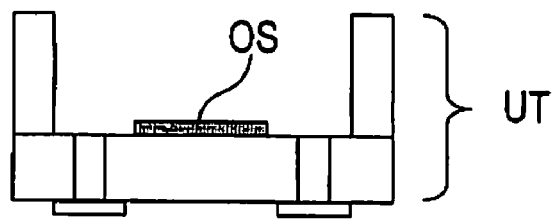

In the next step, a sacrificial layer OS is deposited and structured in the interior of the bottom part. It is sufficient when the terminals on the bottom of the bottom part are exposed for the structuring. FIG. 5B shows the arrangement with the structured sacrificial layer OS.

Figure 5C:
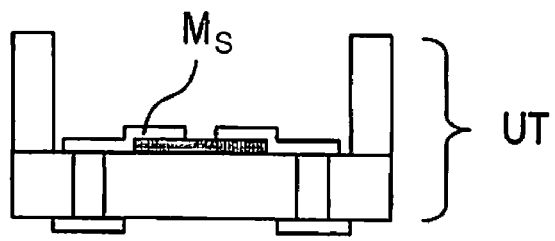

In the next step, in the interior of the bottom part, metallization is deposited and structured so that metal structures $M_S$ are each connected, electrically separated from each other, to a terminal and come to lie with another structure region on the surface of the structured sacrificial layer OS. The metal structures $M_S$ can extend linearly, but are advantageously bent or optionally angled several times, in order to guarantee later elastic deformability of the resulting spring elements in several spatial directions. It is also possible to construct the metal structures $M_S$ as bridge-like structures in which a first and a second end lie directly on the base plate or a terminal in the interior of the bottom part, but in-between a middle region runs over the sacrificial layer OS. FIG. 5C shows the arrangement with structured metal structures $M_S$ as examples.

Figure 5D:
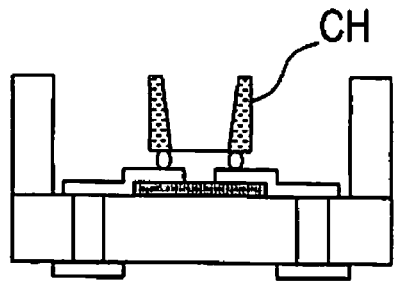

In the next step, a MEMS chip is inserted into the bottom part UT and connected in an electrically conductive way to the metal structures $M_S$. This can be realized by soldering, bonding, welding, or adhesion. FIG. 5D shows an example configuration of a MEMS chip CH connected electrically and mechanically in this way to the metal structures.

In the next step, the structured sacrificial layer OS is removed, so that the parts of the metal structure lying on the sacrificial layer remain at an open spacing to the top side of the base plate BP, that is, produces a free space FR between the higher sections of the metal structure and the base plate.

The sacrificial layer can be removed in a simple way adapted to the material of the sacrificial layer.

Figure 5E:
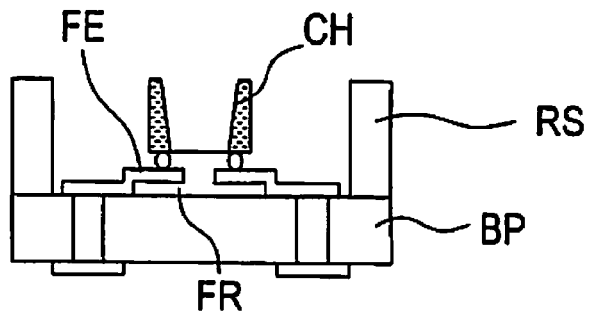

An especially simple configuration uses a material that can decompose thermally, in particular, a polymer already decomposing at moderate temperatures of, e.g., below 300° C. that can be transformed in a thermal step completely into gaseous decomposition products. However, it is also possible to dissolve and thus remove the sacrificial layer OS in a selective process into a liquid phase. FIG. 5E shows the arrangement after the removal of the sacrificial layer.

In principle, however, it is also possible to remove the sacrificial layer directly after the production of the metal structures $M_S$, because the electrical and mechanical connection of the MEMS chip CH with the metal structures becoming the spring elements FE after the removal of the sacrificial layer is possible in a simple way in that the spring elements can be pressed arbitrarily against the top side of the base plate BP for mounting, bonding, or adhesion, without losing the spring function of the spring elements, and the spring force therefore leads to the recreation of the original arrangement with the free space FR.

FIG. 6 shows one possible configuration of the method in which another inner metallization $M_I$ is deposited on the lateral inner walls of the bottom housing part UT, and consequently on the inner walls of the frame structure. This inner metallization $M_I$ can be generated simultaneously with the metal structure $M_S$ for the later spring elements. It is also advantageous to simultaneously generate frame metallization $M_R$ on the top edge of the frame structure RS or to leave frame metallization $M_R$ for the structuring of a metal layer deposited over the whole surface. The inner metallization $M_I$ is used for shielding the MEMS chip, while the frame metallization $M_R$ allows simpler bonding, welding, or soldering of a metallic or metal-coated cover AB.

FIG. 7 shows an arrangement in which the cover AB is connected to the top side of the MEMS chip and the frame metallization $M_R$. In addition, the housing here has a multiple-layer base plate BP that can be used for a bottom part of the housing. Shown in FIG. 7 is a base plate with two dielectric layers and a metallization structure embedded in-between. The terminals arranged in the housing are each connected by means of two vias each through a layer and the inner metallization plane is connected to an SMT contact K.

Example metallization M that is suitable for the production both of the inner metallization $M_I$, the frame metallization MR, and the metal structures $M_S$ can be produced as follows. Initially, an adhesive layer that consists of, for example, 50 nanometers Ti and 200 nanometers Cu, is deposited, for example, through sputtering, on the entire surfaces to be coated. In addition, for structuring, a photoresist is then deposited, for example, by means of spray coating or through lamination of a dry resist film. The photo lacquer or dry resist film here follows the topography of the recess and the sacrificial layer. This can be achieved, for example, through vacuum lamination that supports deposition without cavities.

The exposure of the photoresist can be performed with masks. Large surface area, non-distortion free base plates, such as, for example, base plates made from ceramic can also be exposed by means of a scanning device and, in particular, with a laser illuminator. A negative photoresist is especially advantageous, because then the vertical flank, that is, the inner wall of the frame structure RS does not need to be exposed. In this way, a resist structure can be generated that makes uncovered areas of the additional metal deposition accessible in a galvanic method. By means of exposure using a laser, however, it is also possible to deposit the resist structure and metal structures on arbitrarily inclined inner walls.

In the subsequent galvanic process, metal structures $M_S$, inner metallization $M_I$, and frame metallization $M_R$ are deposited galvanically on the regions not covered by the photoresist. Advantageously, in this process, copper, nickel, or chromium is deposited at a thickness up to a total of two to 50 μm. The metallization can also include other selectively deposited layers that are used, for example, for oxidation protection (by means of a gold or palladium layer), bonding ability (for example, by means of a nickel or gold layer), solder wetting (for example, by means of a gold, palladium, or silver layer), or solder removal (for example, by means of a titanium, chromium, or aluminum layer). These additional layers can be generated before or after the removal of the resist structure.

The mounting of the MEMS chip or the electrical and mechanical connection can be realized by means of gold stud bumps in the thermosonic bonding method on the metal structures $M_S$ or the exposed spring elements FE. For the galvanic generation of the different metallization layers, in the last step, the thin exposed adhesive layer is also etched after the removal of the sacrificial layer.

For the production of the metallization layers, numerous embodiments are possible. For example, the metal structures can also be etched by the structuring of large surface area, deposited metal layers. It is also possible to activate regions to be provided for metal coating, in particular, on plastic surfaces and then to realize a wet-chemical metallization. For this purpose, MID (Molded Interconnect Device) technology is provided.

For all of the embodiments the dimensioning of the housing is realized so that a sufficiently large rear volume is available. For embodiments with the sound inlet opening at the top, the size is selected so that at least 75% of the inner volume not forced from the MEMS chip is available as acoustic rear volume.

With embodiments of the invention, an encapsulated MEMS microphone is specified that guarantees an optimized rear volume for the acoustic microphone function for a minimum overall height. The base area of the housing is also minimized and smaller than known embodiments of encapsulated MEMS microphone chips.

With the proposed component and the production methods, it is also possible to install the MEMS chip CH without stress in the housing G, which also guarantees an essentially undistorted microphone function for mechanical loading or strain on the component due to temperature changes. The housing can be varied arbitrarily with respect to the materials used for this purpose and the exact geometric configuration. For the bottom part, frame structure, and cover, the same or different materials can be used. Advantageously, however, at least the base plate includes a layer of a dielectric material, so as to isolate the different terminals and SMT contacts from each other.

For the component, an arbitrary number of MEMS chips with microphone functioning can be used that optionally function according to different principles. Preferably, MEMS chips with membranes are used. In principle, however, it is also possible to use a MEMS chip with a microphone function constructed or realized in a different way. Those with membranes and above a recess can have, as shown, a conical recess that are realized automatically due to crystal axis-oriented etching or mainly due to isotropic etching. In principle, naturally also recesses with vertical or differently constructed side walls for MEMS chips are suitable, which allows a further reduction of the surface area requirement of the component with respect to the spared surface area.

What is claimed is:

1. A component with MEMS microphone, the component comprising:
    a housing that has a cavity;
    terminals arranged in the cavity;
    a sound inlet opening;
    SMT contacts on an outer side of the housing; and
    a MEMS chip with microphone function that is installed in the cavity of the housing and closing the sound inlet opening from the inside, the MEMS chip being connected by means of an electrically conductive connection to the terminals arranged in the cavity of the housing and being connected through the housing to the SMT contacts, the MEMS chip being in mechanically intimate contact with the housing with its surface lying opposite the electrically conductive connections,
    wherein a back side volume for the microphone function of the MEMS chip is expanded from the cavity in the housing to sides of the MEMS chip, and wherein the sound inlet opening is closed tightly by a surface of the MEMS chip, but on an opposite surface of the MEMS chip, between the housing and MEMS chip there is a connection suitable for quick pressure equalization between this surface and the cavity in the housing at sides of the MEMS chip.

2. The component according to claim 1, wherein the mechanically intimate contact is realized by means of an elastic compound that is arranged between the MEMS chip and the housing.

3. The component according to claim 1, wherein the SMT contacts are arranged on the bottom side of the housing and wherein the MEMS chip is mounted on a housing floor by means of a flip-chip-like connection.

4. The component according to claim 1, wherein the MEMS chip is mounted on a housing floor with an electrically conductive adhesive.

5. The component according to claim 1, wherein the MEMS chip is mounted on a housing floor directly or indirectly by means of a solder point.

6. The component according to claim 1, wherein the SMT contacts are arranged on a bottom side of the housing and wherein the sound inlet opening points upward.

7. The component according to claim 1, wherein the housing comprises a metallic material or has a metallic coating.

8. The component according to claim 1, wherein the housing includes a bottom part and a cover, wherein, in the bottom part, there is a recess defining the cavity.

9. The component according to claim 8, wherein the cover includes a structured metal foil or a structured, metal-coated plastic foil with a sound inlet opening.

10. The component according to claim 8, wherein the cover is bonded, soldered, or welded on the bottom part.

11. The component according to claim 1, wherein the sound inlet opening includes a region with a plurality of smaller openings arranged in this region.

12. A component with MEMS microphone, the component comprising:
    a housing that has a cavity;
    terminals arranged in the cavity;
    a sound inlet opening;
    SMT contacts on an outer side of the housing; and
    a MEMS chip with microphone function that is installed in the cavity of the housing and closing the sound inlet opening from the inside, the MEMS chip being connected by means of an electrically conductive connection to the terminals arranged in the cavity of the housing and being connected through the housing to the SMT contacts, the MEMS chip being in mechanically intimate contact with the housing with its surface lying opposite the electrically conductive connections,
    wherein a back side volume for the microphone function of the MEMS chip is expanded from the cavity in the housing to sides of the MEMS chip, and wherein the electrically conductive connections comprise spring elements.

13. A component with MEMS microphone, the component comprising:
    a housing that has a cavity;
    terminals arranged in the cavity;
    a sound inlet opening;
    SMT contacts on an outer side of the housing; and
    a MEMS chip with microphone function that is installed in the cavity of the housing and closing the sound inlet opening from the inside, the MEMS chip being connected by means of an electrically conductive connection to the terminals arranged in the cavity of the housing and being connected through the housing to the SMT contacts, the MEMS chip being in mechanically intimate contact with the housing with its surface lying opposite the electrically conductive connections, wherein a back side volume for the microphone function of the MEMS chip is expanded from the cavity in the housing to sides of the MEMS chip, wherein a housing floor includes a circuit board, and wherein the circuit board has vias that connect the terminals to the SMT contacts.

* * * * *